(12) United States Patent
Azimi et al.

(10) Patent No.: US 7,413,936 B2
(45) Date of Patent: Aug. 19, 2008

(54) METHOD OF FORMING COPPER LAYERS

(75) Inventors: Hamid Azimi, Chandler, AZ (US); Debabrata Gupta, Scottsdale, AZ (US); Saliya Witharana, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 39 days.

(21) Appl. No.: 11/269,955

(22) Filed: Nov. 9, 2005
(Under 37 CFR 1.47)

(65) Prior Publication Data
US 2006/0060946 A1 Mar. 23, 2006

Related U.S. Application Data

(60) Division of application No. 10/234,030, filed on Sep. 3, 2002, now Pat. No. 7,005,727, which is a continuation of application No. 10/033,382, filed on Dec. 28, 2001, now abandoned.

(51) Int. Cl.
*H01L 21/82* (2006.01)

(52) U.S. Cl. .................. 438/132; 438/215; 438/281; 438/333; 438/467; 438/601; 257/529; 257/665

(58) Field of Classification Search .............. 438/132, 438/215, 281, 333, 467, 601; 257/529, 665
See application file for complete search history.

(56) References Cited

U.S. PATENT DOCUMENTS

| | | | |
|---|---|---|---|
| 4,198,744 A * | 4/1980 | Nicolay | .............. 438/601 |
| 4,747,076 A | 5/1988 | Mukai | |
| 4,790,912 A * | 12/1988 | Holtzman et al. | .............. 216/17 |
| 4,851,615 A | 7/1989 | Butt | |
| 5,019,457 A | 5/1991 | Nishio | |
| 5,854,510 A | 12/1998 | Sur, Jr. et al. | |
| 5,970,517 A | 10/1999 | Jordan | |
| 6,133,054 A | 10/2000 | Henson | |
| 6,219,253 B1 | 4/2001 | Green | |
| 6,235,557 B1 | 5/2001 | Manley | |
| 6,333,468 B1 | 12/2001 | Endoh et al. | |
| 6,344,371 B2 | 2/2002 | Fischer et al. | |
| 6,465,886 B1 * | 10/2002 | Horiuchi et al. | .............. 257/738 |
| 6,528,883 B1 | 3/2003 | Dunham et al. | |
| 6,771,476 B2 | 8/2004 | Fukuoka et al. | |
| 2002/0175800 A1 | 11/2002 | Stanek et al. | |
| 2003/0071323 A1 | 4/2003 | Chou et al. | |

* cited by examiner

*Primary Examiner*—Andy Huynh
(74) *Attorney, Agent, or Firm*—Schwegman, Lundberg & Woessner, P.A.

(57) ABSTRACT

A programmable package with a fuse embedded therein, and fabrication method are provided. The fuse has first and second terminal ends joined by a central portion defining a fusible link. The ends include a portion of the first and second conductive layers, the central portion including a portion of the first conductive layer. The first layer may be electroless copper and the second layer may be electrolytic copper. The fuse may have a dog-bone or a bow tie shape. The method includes providing a substrate with a dielectric layer, and forming the fuse by depositing first conductive layer, forming and patterning second conductive layer over a portion of the first layer, and patterning first layer to form interconnects between areas of the second layer.

4 Claims, 4 Drawing Sheets

METHOD OF FORMING COPPER LAYERS

This application is a divisional of U.S. application Ser. No. 10/234,030, filed on Sep. 3, 2002 now U.S. Pat. No. 7,005,727, which is a continuation of U.S. application Ser. No. 10/033,382 filed Dec. 28, 2001 now abandoned. These applications are incorporated herein by reference.

TECHNICAL FIELD OF THE INVENTION

The present invention relates generally to integrated circuit packaging and in particular the present invention relates to a low cost programmable central processing unit (CPU) package/substrate and to a manufacturing method related thereto.

BACKGROUND OF THE INVENTION

Integrated circuits (ICs) are made up of electronic components linked together by conductive connections to form one or more functional circuits. ICs are typically formed in a piece of silicon called a chip or die. Silicon dice can be formed in a wafer that is a sheet of silicon with a surface that is subject to a series of fabrication steps to form a pattern of identical ICs. The ICs are separated from each other by a repeating pattern of scribe lines, also called saw lines, in the surface of the wafer that serve as boundaries between the dice. One IC is formed on each die. At a stage in a fabrication process the dice are diced (cut apart) from the wafer along the scribe lines and each die is bonded to a substrate to form an IC package.

A substrate is a relatively flat and rigid structure that provides mechanical support for the die in the IC package, transmits signals to and from the IC, and can also transfer heat that is generated during the operation of the IC. The substrate may also be called a carrier. The substrate includes conductive leads connected to respective bonding pads on the die so that the IC may exchange signals with other circuits in the IC package and circuits connected to the IC package. Additional elements such as resistors and capacitors that are not readily included in the IC may be attached to the top or bottom of the IC package. The IC package may be applied to a circuit board assembly that comprises systems of interconnected IC packages to form an electronic device such as a computer or a cellular phone.

One method of bonding a die to a substrate in an IC package is called a flip-chip bonding method. One version of the flip-chip bonding method is formally known as the controlled collapse chip connection or C4 method. In the flip-chip bonding method, solder bumps are placed on bonding pads on the dice while they are connected together in the wafer. The wafer is then diced to separate the dice. Each die is then turned over, or flipped, and aligned with a corresponding pattern of bonding pads or solder bumps on a substrate. A second reflow procedure is carried out to join the bumps to form a series of solder columns between the die and the substrate. The solder columns serve as conductive connections or leads between an IC in the die and the substrate through which I/O signals are transmitted, and power is delivered.

Todays wide range of market segmentation for the microprocessor industry has created challenges in inventory management. These challenges could be solved by having technology and manufacturing capability flexible enough to allow classification of a product in the last manufacturing process step.

Attempts to solve this problem have been made, but have created more complications in the manufacturing process. Presently changes in product classification are accomplished by using external components such as an external fuse (see FIG. 1, designated Prior Art, showing a flip chip pin grid array, or FCPGA type package using external caps/fuse). In this approach, external fuses are programmed to short certain circuits and thus change the product classification. This approach has a number of disadvantages, including the high cost of the extra components, and the need for extra "real estate" on the package to place the additional components. This leads to a larger package body size and thus a higher cost. Further, this approach presents complications in the assembly process and more designs and line items for suppliers and manufacturers to manage.

For the reasons stated above, and for other reasons stated below which will become apparent to those skilled in the art upon reading and understanding the present specification, there is a need in the art for technology and manufacturing capability which are flexible enough to allow the classification of the product in the last manufacturing process step.

The above mentioned problems with integrated circuit packaging and other problems are addressed by the present invention and will be understood by reading and studying the following specification.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

The present invention provides a solution to problems related to the manufacture and use of external fuses used for changing product classification, by providing fuses embedded in a substrate and a process for fabricating same. Various embodiments are illustrated and described herein.

Figure 1:
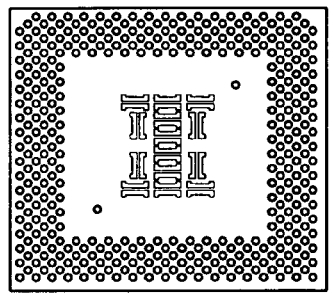
FIG. 1 is a top plan view of a Prior Art integrated circuit package having an external fuse.
Figure 2:
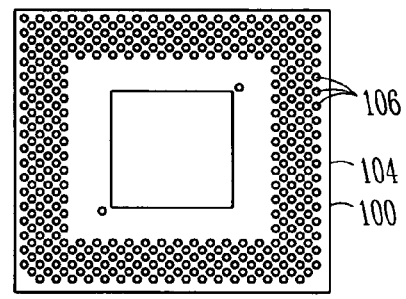
FIG. 2 is a top plan view of an integrated circuit package in accordance with the present invention.

A top plan view of an integrated circuit package 100 is provided in FIG. 2. The package 100 includes at least one integrated circuit die and a substrate 104. The substrate includes numerous conductive pins 106 that downwardly extend from the substrate and are provided for electrical connection to an external device. The illustrated package includes beneficial features that are explained in greater detail below. Specifically, the package has a fuse embedded thereon. The fuse enables product differentiation, and enables the use of very small currents. In accordance with the process of the present invention, the fuse may be mass produced in a stable way. Small currents are required to blow the fuse to effect product differentiation. It is less desirable to use higher currents as used by external fuses, which may damage the surrounding area.

In one embodiment, the present invention provides a low cost programmable package with a fuse embedded therein. The substrate has a layer of dielectric material coupled thereto, a first conductive layer deposited over selected portions of the dielectric material, and a second conductive layer deposited over selected portions of the first conductive layer, and a fuse embedded on the substrate. The fuse comprises at least a portion of the first conductive layer and at least a portion of the second conductive layer. In one embodiment, the first and second layers are a conductive metal layer.

In one embodiment, the first conductive layer is thin electroless copper plated over selected portions of the dielectric material, and the second conductive layer is electrolytic copper plated over selected portions of the thin electroless copper layer.

Figure 3:
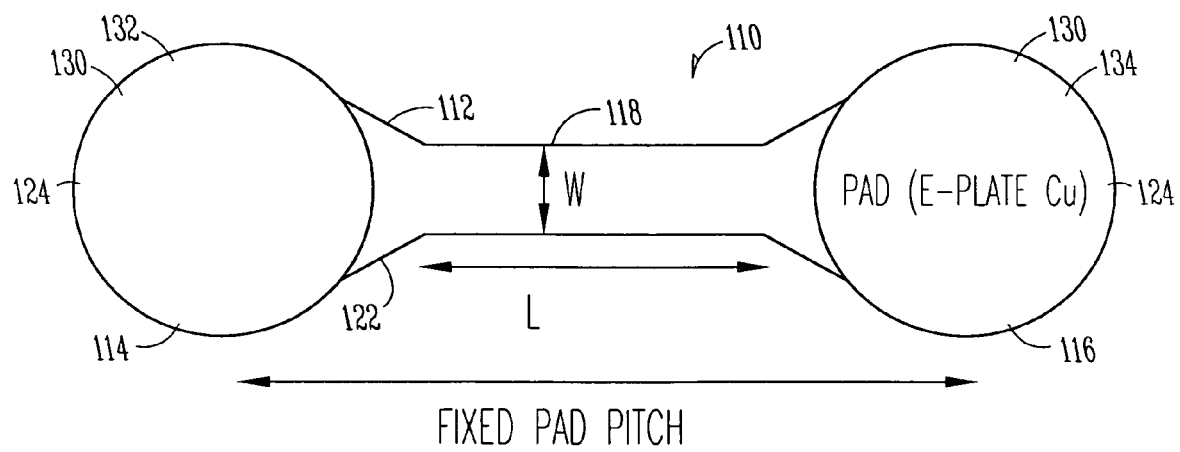
FIG. 3 is a top plan view of a fuse in accordance with the present invention.

Referring to FIG. 3, a top plan view of a fuse 110 is provided, greatly enlarged to show detail. In one embodiment, the fuse 110 comprises a first conductive layer 112 which extends beneath and between pads 114, 116 formed of a second conductive layer 124. In one embodiment, layer 112 is a thin layer of copper 122 plated by an electroless plating process known in the art. In one embodiment, the layer of copper 122 may be an alloy of copper or any other conductive material which may be plated by an electroless plating or a sputtering process.

Central portion 118 of fuse 110 is made of thin electroless copper layer 122. In one embodiment, central portion comprises a portion of the thin electroless copper layer. In another embodiment, central portion consists essentially of a portion of the thin electroless copper layer. Terminal pads 114, 116 include a portion of the electroless copper layer 122 and second conductive layer 124, a layer of copper 130 plated by an electrolytic plating process known in the art. In one embodiment, the second conductive layer material is copper, copper alloy or any other conductive material which can be plated by an electrolytic plating process.

In one embodiment, as shown in FIG. 3, the fuse 110 has terminal ends 132, 134 having a width or diameters which exceed the width of the central portion 118. In one embodiment fuse 110 is shaped like a dog-bone having a first terminal end 132 and a second terminal end 134, and central portion or fusible link 118 extending therebetween. In one embodiment, the fuse is shaped like a bow tie, with the terminal end pads 132 and 134 having a generally triangular shape. The first and second ends 132, 134 include portions of the thin electroless copper layer 122 and the electrolytic copper layer 130, and the central portion 118 includes a portion of the thin electroless copper layer 122.

The fuse is a terminally activated fuse, which blows due to an increase in current, which causes an increase in heat. A terminally activated fuse is a fuse designed to be used one time only. After the terminally activated fuse blows due to an increase in current, its job is done and there is no further need for it. An increase in current density controls heat generation. To maximize current density and heat, the dimensions of the fuse, i.e. thickness, width and length of the fuse are controlled. The current required to blow the fuse is minimized to reduce damage to the surroundings. The restricted cross sectional area of the central portion 118 of fuse 110 provides an increase in current density in that area without increasing the absolute value of the current. This is accomplished in a way not appreciated before, by utilizing the thin electroless copper which is already a part of the normal buildup process (shown schematically in the flow diagram at FIG. 8) to create a fuse of microscopic dimensions which may be mass produced utilizing existing equipment. To maximize current density, the cross sectional area of the fuse is controlled. The thickness at the fusible link or central portion 118 of the fuse is from about 0.80 to 2.0 microns thick. In one embodiment, the thickness is about 1.0 micron.

In addition, the current density is maximized by controlling the width of the fuse. In one embodiment, the width W of the fuse is from about 10-100 microns. In one embodiment, the width W is from about 30-40 microns. In one embodiment, the width W at the central portion 118 is about 10 microns. The current is supplied through both ends of the fuse. The fuse is constructed to blow at the fusible link or central portion 118 by providing first and second copper terminals 136, 138 at each end 132, 134. The ends 132, 134 draw heat away from the central portion 118, and this heat flow to the ends minimizes heat flow to the rest of the die or substrate.

The length of the fuse is also a factor, as a longer fuse will minimize heat loss. In one embodiment, the length L of the fuse is from about 30-100 microns. In one embodiment, the length L of the fuse is from about 80-100 microns.

In one embodiment, the present invention provides a microprocessor package comprising a substrate with a layer of dielectric material coupled thereto, a first conductive layer deposited over selected portions of the dielectric material, a second conductive layer deposited over selected portions of the first conductive layer and a fuse embedded on the substrate, the fuse comprising at least a portion of the first conductive layer and the second conductive layer.

In one embodiment, the microprocessor package comprises a substrate with a layer of dielectric material coupled thereto, a layer of thin electroless copper 122 plated over selected portions of the dielectric material 120, a layer of electrolytic copper 130 plated over selected portions of the thin electroless copper layer 122 and a fuse embedded on the substrate, the fuse comprising at least a portion of the thin electroless copper layer and the electrolytic terminal (electrolytic copper layer).

The fuse of the present invention minimizes current required to blow the fuse. Any suitable conductive metal, including metal alloys may be used. In one embodiment, copper is used although the energy requirement to blow a copper fuse is not very low. The copper layer is already a part of the buildup process. Applicant's novel method has found a way to utilize a material already used in the buildup process despite its high energy requirements, to create a thermal fuse which minimizes heat loss from the fuse to the surroundings and minimizes damage to the surroundings. By controlling the shape and dimensions of the fuse, the energy required and heat generated are minimized. The real estate required for the fuse is minimized by the compactness of the fuse.

In one embodiment, the present invention provides a method for fabricating an integrated circuit substrate with a fuse embedded therein comprising first and second conductive layers, the fuse having a dog-bone shape with first and second ends and a central portion. A first conductive layer is formed on a dielectric layer. A second conductive layer is formed and patterned over the first conductive layer. The first and second ends define terminals comprised of the first and second conductive layers. The first conductive layer is patterned to form desired interconnects between areas of the second conductive layer.

In one embodiment, the present invention provides a method for forming a programmable package. A substrate is provided, with a layer of dielectric material coupled thereto. A fuse is fabricated on the substrate or dielectric. A first conductive layer is formed over the dielectric material. A second conductive layer is formed over a first portion of the first conductive layer. A second portion of the first conductive layer is removed while leaving a third portion of the first conductive layer, the first conductive layer being patterned to form a path between areas of the first portion thereof.

In one embodiment, the present invention provides a method for forming a programmable package. A substrate is provided, with a layer of dielectric material coupled thereto. A fuse is fabricated on the substrate or dielectric. A thin layer of electroless copper is formed over the dielectric material by chemical plating. A layer of electrolytic copper is formed over a first portion of the thin electroless copper layer. A second portion of the thin electroless copper layer is removed while leaving a third portion of the thin electroless copper layer, the thin electroless copper layer being patterned to form a path between areas of the first portion thereof.

Figure 4:
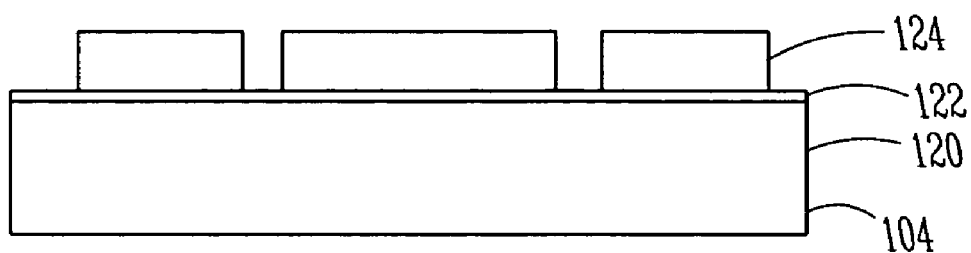
FIG. 4 is a partial cross section view of the circuitry in a CPU substrate.
Figure 5:
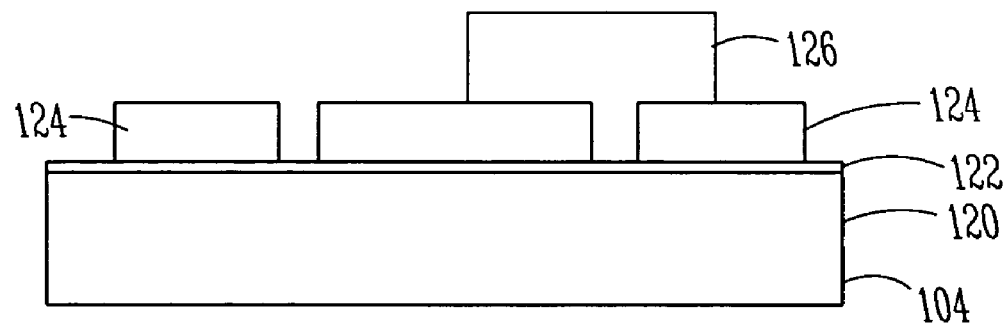
FIG. 5 is a partial cross section view of part of the circuitry in a CPU substrate, showing a resist layer applied over certain areas of the first conductive layer.
Figure 6:
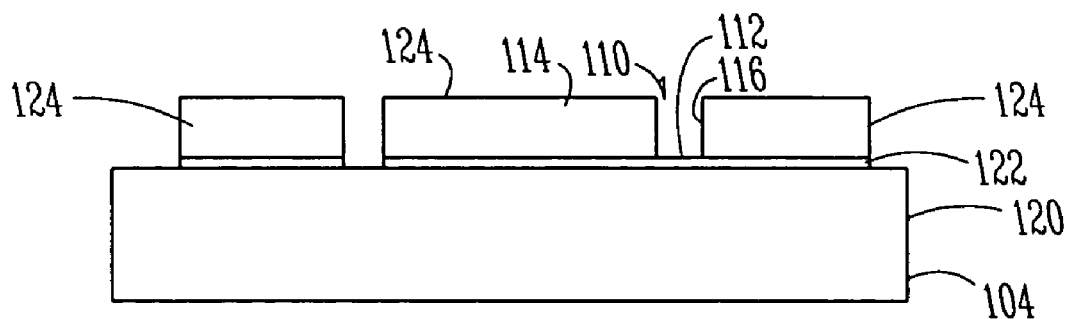
FIG. 6 is a partial cross section view of an integrated circuit package in accordance with the present invention.

Referring to FIGS. 4-7, a method for forming an integrated circuit package with a fuse embedded thereon in accordance with the present invention is described. FIGS. 4-6 are schematic partial cross section views. FIG. 6 is a schematic partial cross section view of a completed integrated circuit package with a fuse in accordance with the present invention.

Figure 7:
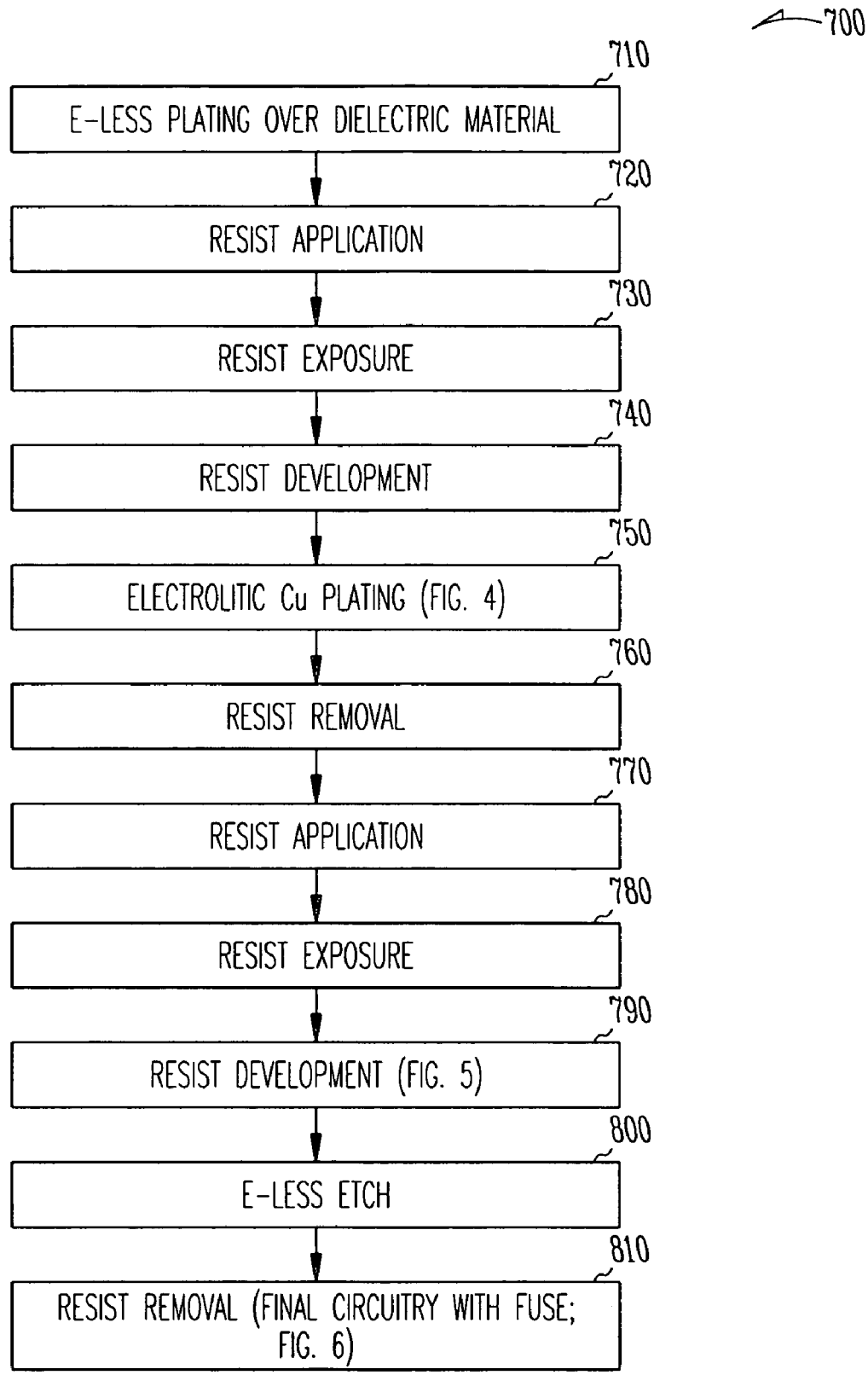
FIG. 7 is a flow diagram of a method of fabricating an integrated circuit package with a fuse embedded therein, in accordance with the present invention.

FIG. 7 is a flow chart of a process in accordance with the present invention. In accordance with one embodiment of the present invention, a method (700) includes forming a thin layer of copper over a dielectric material by chemical plating (710), applying a first resist over selected portions of the thin copper layer (720), exposing the first resist (730), developing the first resist (740), plating copper by electrolytic plating (750), and removing the first resist (760).

In one embodiment of the present invention, this portion of the process corresponds to the partial cross section shown at FIG. 4. The substrate 104 includes a layer of dielectric material 120. On top of the dielectric layer 120 is a layer of conductor material 112, such as copper. In the process of the present invention, a thin layer of copper 122 is plated by electro-less plating or sputtering over the dielectric material 120 by a process known in the art. Referring to FIG. 7 (720, 730 and 740), a first resist is applied over the thin electroless copper layer, and exposed and developed by processes known in the art. In one embodiment, the resist material is any liquid resist applied by a coating process known in the art for making organic substrates or packages. In a further embodiment, the resist material is any dry film resist applied by a lamination process known in the art for making organic substrates or packages. Electrolytic copper plating by a process known in the art leaves a second conductive layer 124, a layer of electrolytic copper 130 over selected areas of thin copper layer 122. The resist is removed (760 of FIG. 7).

In the process of the present invention, the electro-less copper etch is delayed. Referring again to FIG. 7, a second resist is applied over certain areas of the electroless thin copper (770). The resist material can be either a liquid resist or a dry film resist. The application of the resist is done through a lamination or a coating process depending on the type of the resist. In one embodiment, the resist material is a liquid resist applied by a coating process known in the art. In a further embodiment, the resist material is a dry film resist applied by lamination by a process known in the art. After application of the second resist (770), the second resist is exposed (780) and developed (790). A mask and an exposure tool is used to preferentially expose certain areas of the second photo resist polymer. Unexposed areas of the resist are removed during a chemical developmental etch process exposing the thin copper in layer 122 one more time. The exposed area, on the other hand, is polymerized via light energy. Electroless etching is performed (800), during which the polymerized material (second photo resist polymer shown at 126 of FIG. 5) resists against the etching solution and thus remains intact and protects the thin copper. The electroless etching process is known in the art. In one embodiment, the exposed thin copper is etched off through an acid etching process. The exposed areas of the second resist are removed through a chemical stripping process (810). The chemical stripping process for resist removal is also known in the art. Referring to FIGS. 3 and 6, the result is circuitry with a fuse 110.

The necessary circuitry is complete for programming the package. The embedded fuse of the present invention provides a solution to problems related to the manufacture and use of external fuses used for changing product classification, by providing one or more fuses embedded in the substrate. The package including the embedded fuse or fuses according to the invention where the fuse(s) are unblown will have different characteristics than the same package after one or more fuses have been blown. In one embodiment, the present invention provides a method for changing operating characteristics of a device, the method comprising providing a device comprising a substrate; fabricating at least one fuse on the substrate, the device having a first set of operating characteristics suitable for a first product; and blowing the at least one fuse resulting in a device having a second set of operating characteristics suitable for a second product. Each product or chip has its own operating characteristics.

The internal fuse and method of the present invention provides one generic packaging solution that can be used for different products. Depending on the product, one can apply certain current to blow a particular fuse in the package, soft programming to make the package suitable for the particular product desired. For example, in one embodiment a package may be provided having a number of fuses. A nonlimiting example is a package having at least two fuses, which are provided certain current. For example, a first fuse is provided which will receive a 1 Amp current, and a second fuse is provided to receive a 2 amp current. When electricity is provided to the package certain current will reach the fuse(s). In one embodiment a package having at least two fuses is capable of operating at 750, 850 or 900 MHZ. Blowing the first fuse results in a processor capable of operating at 750 MHz. Blowing the second fuse results in a processor capable of operating at 850 MHz. Blowing no fuses would result in a processor capable of operating at 900 MHz. According to the present invention, one organic substrate or package can be programmed a number of ways to result in a number of different packages having different features. Each product (chip) has its own operating characteristics. The internal fuse method provides one generic packaging solution that can be used for many different products.

In one embodiment, the present invention includes a process for hard programming of structures contained within the package to optimize yield and minimize collateral issues, i.e. reliability of programmed and neighboring unprogrammed structures within, utilizing the embedded fuse. The resulting substrate enables the classification of a product in the last manufacturing process step, by shorting certain circuits to change product classification, without using an external fuse.

The attendant disadvantages of using an external fuse, i.e. the high cost of the extra components, and the need for extra ""real estate"" on the package to place the additional components, larger package body size, higher cost and complications in the assembly process including damage to the substrate or die, are either avoided or significantly minimized.

After programming, the normal build up process for the substrate continues from here on in a manner known in the art of making organic build up substrates including both Ball Grid Array (BGA) or Pin Grid Array (PGA) types.

Figure 8:
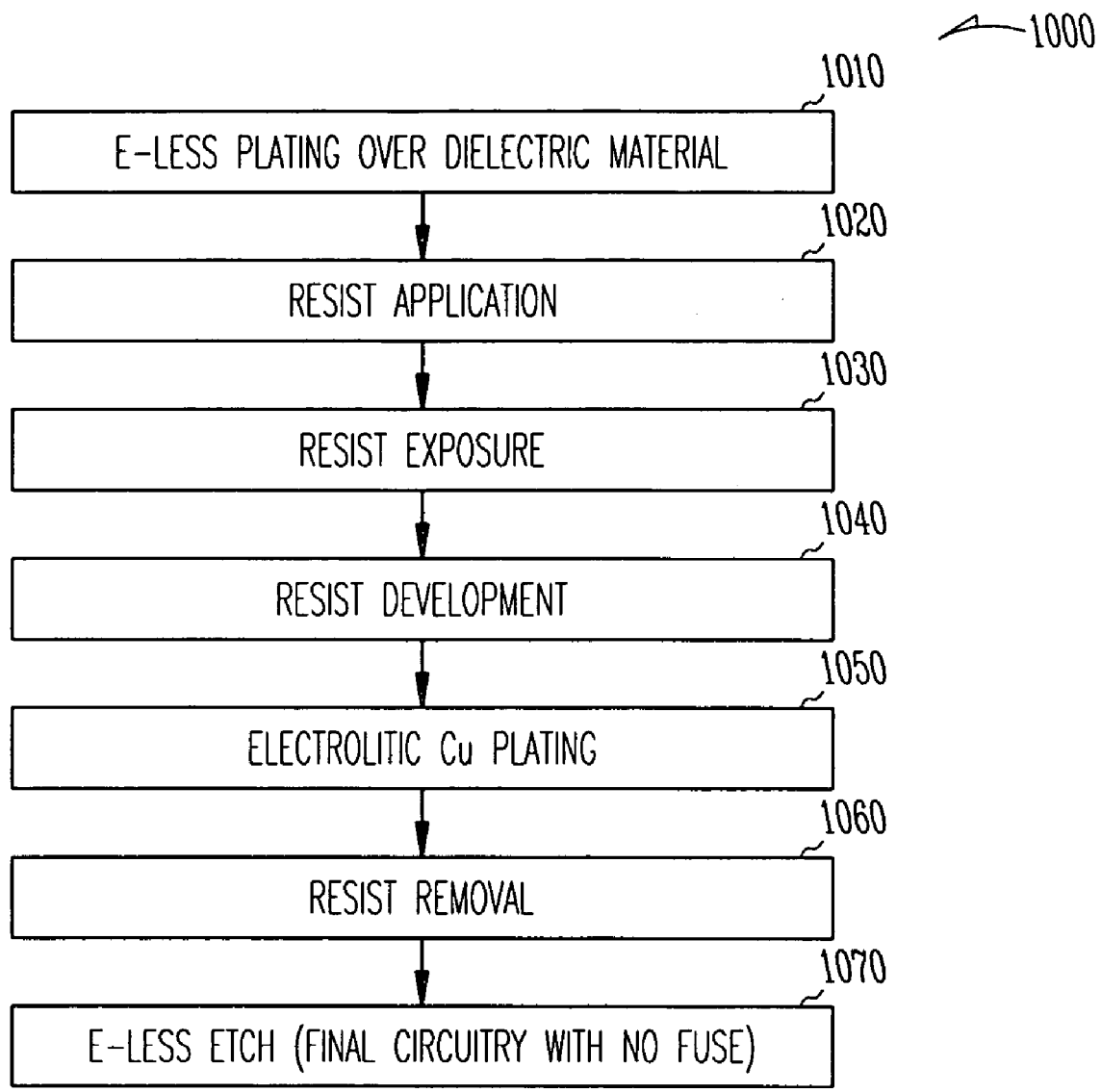
FIG. 8 is a flow diagram of a prior art process for forming an integrated circuit package with no fuse.

Referring to FIG. 8, a flow chart of a prior art method in current use for preparing an integrated circuit with no fuse is shown. This method (1000) includes forming a thin layer of copper by chemical plating (1010), applying a resist (1020), exposing the resist (1030), developing the resist (1040), plating copper by electrolytic plating (1050), removing the resist (1060), etching by electroless etch (1070), and removing the resist (1080). In the normal build up process of making substrate for CPU packages in current use, the electro-less thin copper is etched off after pattern plating (making circuitry).

As shown by comparison of Flow Diagram 7 with Flow Diagram 8 (Prior Art) it is seen that the equipment and technology to perform the fabrication of a fuse-less CPU package have been used in an unexpected manner to fabricate a novel low cost programmable CPU package having a programmable fuse embedded therein.

A thin layer of copper formed by a chemical plating process is used in the substrate making process of the present invention. The present invention uses the thin copper that has already been plated in the manufacturing process. The present invention also uses a photo imageable dry film resist or liquid photo resist as an essential part of the substrate making process. Lamination of a dry resist film or coating or a liquid photo resist film are already utilized in the substrate process. Exposure is likewise an essential part of substrate making process regardless of this invention, and is being used to preferentially polymerize certain areas of the second resist material. The polymerized second resist will remain to preferentially protect the thin copper in certain areas in the copper etch process. The chemical development process for the resist is a part of substrate making processes, and is being used in an unexpected manner a second time to remove the unexposed second resist, thus exposing certain areas of the thin copper. These aspects are utilized in a way not appreciated or contemplated in previous substrate making processes. A second resist film is utilized to preferentially protect selected portions of the thin copper layer from being etched-off in the copper etch process (800 of FIG. 7). The thin copper etch process is part of substrate making process, but is being used in an unexpected manner to preferentially etch part of thin copper that is not protected by the resist material. This process isolates the package circuit. Removal of the second photo resist is performed in an unexpected manner a second time to remove the remaining resist which was used to protect the thin copper from being etched. The necessary circuitry is now complete for programming the package.

The present invention may be used on any suitable substrate known in the art. Nonlimiting examples include Intel P858 and P860 substrates and all other new generation substrates.

The process of the present invention provides many advantages. It provides a novel, low cost programmable fuse embedded in a package. The process incorporates well known substrate processes and requires no new or additional equipment. There is therefore less likelihood of process excursions. No external components are used. This leads to a lower cost. There is no need for extra real estate, so the resulting package has a smaller body size. There is no extra assembly process. There are less design and line items to manage by the supplier and manufacturer. This will lead to less expired inventories.

CONCLUSION

The present invention provides a low cost programmable package with a fuse for programming the package embedded therein, and a method for creating the package. In one embodiment the fuse has first and second terminal ends joined by a central portion defining a fusible link. The ends include a portion of the first and second conductive layers, the central portion including a portion of the first conductive layer. The first layer may be thin electroless copper and the second layer may be electrolytic copper. The fuse may have a dog-bone shape. The method includes providing a substrate with a dielectric layer, and forming the fuse by depositing first conductive layer, forming and patterning second conductive layer over a portion of first layer, and patterning first layer to form interconnects between areas of second layer. In one embodiment, the method includes forming a first conductive layer, applying a first resist film, exposing the first resist film, developing the first resist film, depositing a second conductive layer, removing the first resist film, applying a second resist film, exposing the second resist film, developing the second resist film, etching by electroless etch, and removing the second resist film. In one embodiment the first conductive layer is a thin layer of copper deposited by chemical plating, and the second conductive layer is copper deposited by electrolytic plating. The result is a package having circuitry with a fuse integral thereto for programming the package.

Although specific embodiments have been illustrated and described herein, it will be appreciated by those of ordinary skill in the art that any arrangement which is calculated to achieve the same purpose may be substituted for the embodiments shown. This application is intended to cover any adaptations or variations of the present invention. Therefore, it is manifestly intended that this invention be limited only by the claims and the equivalents thereof.

What is claimed is:

1. A method comprising:
    forming a first conductive layer of thin electroless copper layer over a dielectric layer;
    forming a second conductive layer of electrolytic copper layer, formed by electrolytic copper plating in at least two areas above a first portion of the first conductive layer;
    patterning the first conductive layer to remove a second portion thereof and retain a third portion thereof, the third portion forming at least one interconnect between two of the at least two areas of the first portion and,
    patterning the thin electroless copper layer and patterning the electrolytic copper layer so that the areas of the first portion of the first conductive layer include portions of the thin electroless copper layer and the electrolytic copper layer, and the third portion interconnects include a portion of only the thin electroless copper layer.

2. The method recited in claim 1 wherein the thin electroless copper layer has a thickness between about 0.80 to 2.0 microns.

3. The method recited in claim 1 wherein the electroless copper layer is formed over the dielectric material by sputtering.

4. The method recited in claim 1 wherein the electroless copper layer is formed over the dielectric material by chemical plating a layer of copper and wherein forming the electrolytic copper layer comprises:

applying a first resist over at least one selected area of the electroless copper layer;

exposing the first resist;

developing the first resist;

forming the electrolytic copper layer over the electroless copper layer by electrolytic plating; and removing the first resist.

* * * * *